(12) United States Patent
Wang et al.

(10) Patent No.: US 10,101,622 B2
(45) Date of Patent: Oct. 16, 2018

(54) FANOUT WIRING STRUCTURE AND LIQUID CRYSTAL DISPLAY (LCD) PANEL USING THE SAME

(71) Applicant: WUHAN CHINA STAR OPTOELECTRONICS TECHNOLOGY CO., LTD., Wuhan, Hubei (CN)

(72) Inventors: Cong Wang, Hubei (CN); Peng Du, Hubei (CN)

(73) Assignee: WUHAN CHINA STAR OPTOELECTRONICS TECHNOLOGY CO., LTD., Wuhan, Hubei (CN)

( * ) Notice: Subject to any disclaimer, the term of this patent is extended or adjusted under 35 U.S.C. 154(b) by 185 days.

(21) Appl. No.: 14/907,393

(22) PCT Filed: Jan. 6, 2016

(86) PCT No.: PCT/CN2016/070296
§ 371 (c)(1),
(2) Date: Jan. 25, 2016

(87) PCT Pub. No.: WO2017/101179
PCT Pub. Date: Jun. 22, 2017

(65) Prior Publication Data
US 2017/0235199 A1    Aug. 17, 2017

(30) Foreign Application Priority Data
Dec. 15, 2015  (CN) .......................... 2015 1 0934832

(51) Int. Cl.
*G02F 1/136*    (2006.01)
*G02F 1/1362*   (2006.01)
(Continued)

(52) U.S. Cl.
CPC ...... *G02F 1/136286* (2013.01); *G02F 1/1345* (2013.01); *G02F 1/13306* (2013.01); *H01L 27/124* (2013.01)

(58) Field of Classification Search
CPC .......... G02F 1/136286; G02F 1/13306; G02F 1/1345; H01L 27/124
See application file for complete search history.

(56) References Cited

U.S. PATENT DOCUMENTS 9,507,229 B2    11/2016  Chen et al.
2014/0146257 A1*  5/2014  Fujikawa .............. G02F 1/1345
                                                                349/42
(Continued)

FOREIGN PATENT DOCUMENTS

CN        1645196 A     7/2005
CN      104007570 A     8/2014
(Continued)

*Primary Examiner* — James Dudek
(74) *Attorney, Agent, or Firm* — Hauptman Ham, LLP

(57) ABSTRACT

A fanout wiring structure and LCD panel using the same are described. The fanout wiring structure comprises a substrate; a first wire region comprising first conductive wires with a first electric resistivity wherein each first conductive wire comprises a first end point and a second end point, and the first end point is electrically connected to the signal transmission interface; and a second wire region comprising second conductive wires with second electric resistivity wherein each second conductive wire comprises third end point and fourth end point, and the fourth end point is electrically connected to the signal receiving interface; wherein the second end point is electrically and correspondingly connected to the third end point, and each first conductive wire and each second conductive wire form either a collinear structure or a parallel connection structure to construct the fanout wiring structure for equalizing a resistance of each fanout wiring structure.

18 Claims, 5 Drawing Sheets

(51) Int. Cl.
*H01L 27/12* (2006.01)
*G02F 1/133* (2006.01)
*G02F 1/1345* (2006.01)

(56) References Cited

U.S. PATENT DOCUMENTS

2014/0291846 A1* 10/2014 Chai .................... G02F 1/1345
                                                         257/749
2015/0216045 A1   7/2015 Cheng et al.

FOREIGN PATENT DOCUMENTS

| CN | 104076544 A | 10/2014 |
| JP | 3299868 B2  | 7/2002  |

* cited by examiner

US 10,101,622 B2

FANOUT WIRING STRUCTURE AND LIQUID CRYSTAL DISPLAY (LCD) PANEL USING THE SAME

BACKGROUND OF THE INVENTION

Field of Invention

The present invention relates to a technical field of a liquid crystal display (LCD), and more particularly to a fanout wiring structure and liquid crystal display (LCD) panel using the same.

Description of Prior Art

With the development of semiconductor technology, the video products, e.g. digital video or image devices, are very common products in daily life. The display unit used in the digital video or image devices is an important component to display related information. A low temperature poly-silicon (LTPS) thin film transistor (TFT) is applicable to a driving unit of the LCD so that the LTPS LCD is a mainstream display unit in a market of personal computers, gaming consoles and monitors which are the leading products in the future.

Regarding to the small sizes of LTPS panel, the design of high pin count are adopted in the source portion of the panel and the source portion only uses one set of fanout wiring structure and a driving chip. In this structure, the first fanout wire and the last fanout wire disposed in the two source portions of the fanout wiring structure form a greater resistance from the central fanout wire of the fanout wiring structure. For example, the resistance of the first fanout wire and the last fanout wire reaches a maximum value (Rmax) and the resistance of the central one is minimum value (Rmin). When the size of the display panel becomes more and more larger, the resistance difference, i.e. Rmax−Rmain (subtracting Rmax from Rmin), between the first fanout wire and the last fanout wire in relation to the last fanout wire is considerably increased.

Conventionally, during the operation of the display panel, if a major resistance difference exists in the fanout wiring structure, the resistance/capacitance delay (RC delay) is thus more obvious so that the color deviation, e.g. mura effect, occurs between two side portions and central portion of the display panel when the display panel displays the information content. Currently, although the metal with lower electric resistivity is used in the fanout wiring structure to decrease the color deviation between the side portions and central portion, however, it cannot still solve the problem of uneven display status of the display panel. Consequently, there is a need to develop a novel fanout wiring structure to solve the problems of the conventional technique.

SUMMARY OF THE INVENTION

Therefore, one objective of the present invention is to provide a fanout wiring structure and liquid crystal display (LCD) panel using the same wherein the fanout wiring structure of the present invention equalizes the resistance of two adjacent fanout wires to reduce the difference of the maximum resistance value and the minimum resistance value so that the display status of the LCD panel is uniform to improve the color deviation and mura effect in the interests of the larger size design of the display panel.

Based on the above objective, the present invention sets forth a fanout wiring structure according to a first embodiment of the present invention. The fanout wiring structure is electrically connected to a signal transmission interface of a driving circuit and a signal receiving interface of an LCD panel and the fanout wiring structure comprises: a substrate; a first wire region comprising a plurality of first conductive wires with a first electric resistivity wherein each first conductive wire comprises a first end point and a second end point corresponding to the first end point, and the first end point of the first conductive wire is electrically connected to the signal transmission interface; and a second wire region comprising a plurality of second conductive wires with second electric resistivity wherein each second conductive wire comprises a third end point and a fourth end point corresponding to the third end point, and the fourth end point of the second conductive wire is electrically connected to the signal receiving interface; wherein the second end point of each first conductive wire is electrically and correspondingly connected to the third end point of each second conductive wire, and each first conductive wire and each second conductive wire form either a collinear structure or a parallel connection structure to construct the fanout wiring structure for equalizing a resistance of each fanout wiring structure.

In one embodiment, the second end point of each first conductive wire is electrically connected to the third end point of each second conductive wire in a collinear structure by using a via hole.

In one embodiment, the first wire region and the second wire region are disposed on either a same material layer or a different material layer for electrically connecting the first conductive wires to the second conductive wire in either the same material layer or the different material layer.

In one embodiment, the second end point of each first conductive wire is electrically connected to the third end point of each second conductive wire in a parallel connection structure using a via hole for electrically connecting each first conductive wire to each second conductive wire in the collinear structure in order to form the fanout wiring structure.

In one embodiment, the first wire region and the second wire region are disposed on either a same material layer or a different material layer for electrically connecting the first conductive wires to the second conductive wire in either the same material layer or the different material layer.

In one embodiment, a connection line between the first end point of the first conductive wire forms a first reference line, a connection line between the fourth end point of the second conductive wire forms a second reference line, and a line passing through the first end point of each first conductive wire forms a plurality of third reference line and each third reference line is parallel to the second reference line;

wherein an intersection angle between each fanout wire and the second reference line is defined as θ and the each fanout wire comprises the first conductive wire, the second conductive wire and a first leading wire, a vertical projection distance of two first end points of every two first conductive wires along the third reference line is defined as pitch p1, a vertical connection position between the first end point of each first conductive wire and adjacent shorter fanout wire is defined as a fifth end point, and an interval between the first end point of the each first conductive wire and the fifth end point of the adjacent shorter fanout wire is defined as length "x";

wherein an intersection angle between a connection line and the first reference line is defined as α and the connection line between the first end point of each first conductive wire and the fifth end point of the adjacent shorter fanout wire form the connection line, an intersection angle between the first reference line of the first end point of first conductive wire and the third reference line is defined as β, and each first conductive wire is extended to form the first leading wire from the first end point along a direction of the third reference line;

wherein a partial length of first leading wire between the first end point of the first conductive wire and the intersection point is defined as length "y" and the intersection point represents an intersection position between the first leading wire and the third reference line, an interval of the fourth end points in every two second conductive wires on the second reference line is defined as pitch p2, a vertical connection position between the fourth end point of each fanout wire and adjacent longer fanout wire is defined as a sixth end point, an interval between the fourth end point of each fanout wire and the sixth point of the adjacent longer fanout wire is defined as "d", and an interval between the fourth end point of the second conductive wire and the sixth point is defined as distance p3 so that a length difference ΔL between two adjacent longer fanout wires is represented by the following formula:

$$\Delta L = p3 - x - y = (p2 - p1)*(\cos 2\theta - \sin \theta)/\cos \theta.$$

In one embodiment, the first electric resistivity of the first conductive wire is less than the second electric resistivity of the second conductive wire, the first fanout wire comprises one first conductive wire, and the rest of fanout wires respectively comprise one first conductive wire and one second conductive wire.

In one embodiment, a sheet resistance of each first conductive wire is defined as R1 and a sheet resistance of each second conductive wire is defined as R2 so that a compensation resistance difference ΔRn between the second conductive wire of "nth" fanout wire and the first conductive wire of the first fanout wire is represented by the following formula:

$$\Delta Rn = R1*n*(p2-p1)*(\cos 2\theta - \sin \theta)/\cos \theta;$$

where "n" is a positive integer which is greater than one.

In one embodiment, a compensation length "ln" of the second conductive wire for the n-th fanout wire in comparison to the first fanout wire based on the compensation resistance difference ΔRn is represented by the following formula:

$$ln = [R1*n*(p2-p1)*(\cos 2\theta - \sin \theta)/\cos \theta]/(R2-R1).$$

The present invention sets forth an LCD panel according to a second embodiment of the present invention wherein the LCD panel comprises a driving circuit; and a fanout wiring structure in the aforementioned descriptions.

DETAILED DESCRIPTION OF THE PREFERRED EMBODIMENTS

Figure 1:
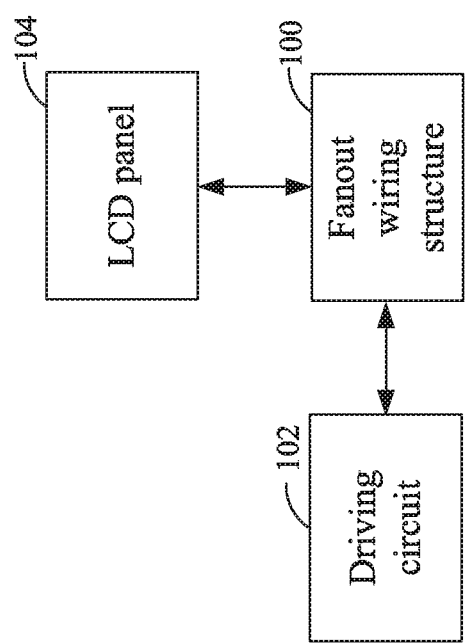
FIG. 1 is a schematic block diagram of a fanout wiring structure of a display panel according to one embodiment of the present invention.

The following embodiments refer to the accompanying drawings for exemplifying specific implementable embodiments of the present invention. Furthermore, directional terms described by the present invention, such as upper, lower, front, back, left, right, inner, outer, side, etc., are only directions by referring to the accompanying drawings, and thus the used directional terms are used to describe and understand the present invention, but the present invention is not limited thereto. In the drawings, the same reference symbol represents the same or a similar component.

Please refer to FIG. 1, which is a schematic block diagram of a fanout wiring structure of a display panel according to one embodiment of the present invention. As shown in FIG. 1, the fanout wiring structure 100 is electrically connected to a signal transmission interface of the driving circuit 102 and the signal receiving interface for transmitting the data signal and power signal of the driving circuit 102 to the display region of the LCD panel 104.

Figure 2:
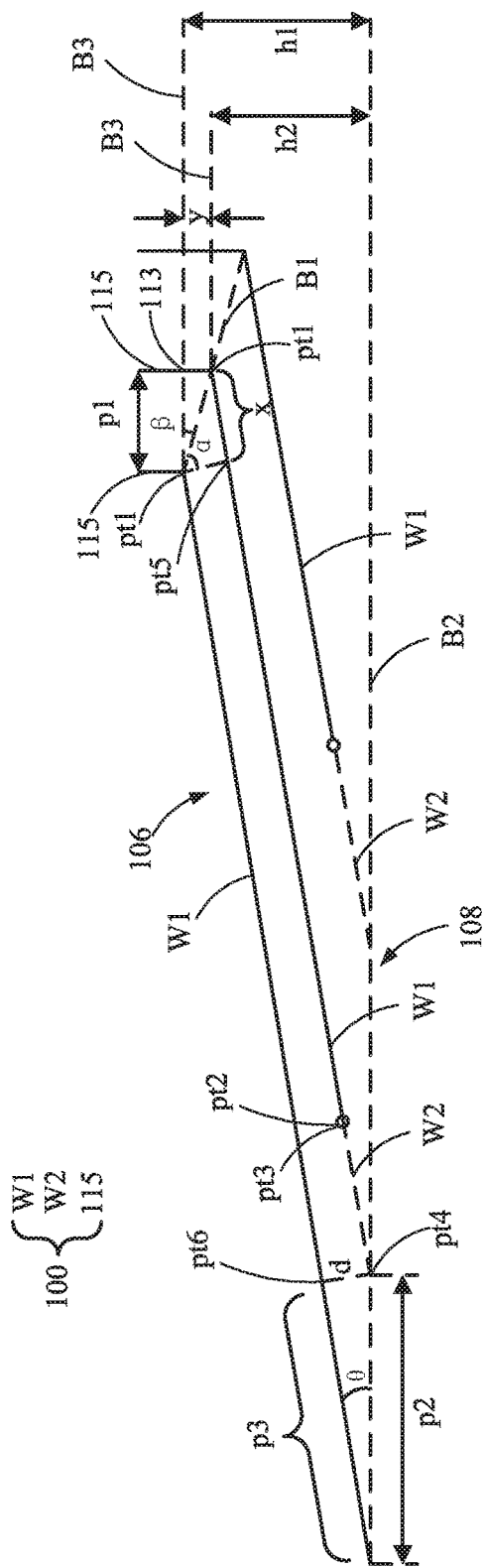
FIG. 2 is a schematic mechanism view of a fanout wiring structure of a display panel according to one embodiment of the present invention.

Please refer to FIG. 2, which is a schematic mechanism view of a fanout wiring structure of a display panel according to one embodiment of the present invention. In FIG. 2, three fanout wires are depicted, but not limited. The connection line between the first end points pt1 of the first conductive wires W1 forms a first reference line B1. The connection line between the fourth end points pt4 of the second conductive wires W2 forms a second reference line B2. The line passing through the first end point pt1 of each first conductive wire W1 forms a plurality of third reference lines B3 and each third reference line B3 is parallel to the second reference line B2. The intersection angle between each fanout wire 100 and the second reference line B2 is defined as θ wherein each fanout wire 100 includes a first conductive wire W1, a second conductive wire W2 and first leading wire 115. A vertical projection distance of two first end points pt1 of every two first conductive wires W1 along the third reference line B3 is defined as pitch p1. A vertical connection position between the first end point pt1 of each first conductive wire W1 and adjacent shorter fanout wire 100 is defined as a fifth end point pt5. The interval between the first end point pt1 of each first conductive wire W1 and the fifth end point pt5 of the adjacent shorter fanout wire 100 is defined as length "x". The intersection angle between a connection line and the first reference line B1 is defined as α wherein the connection between the first end point pt1 of each first conductive wire W1 and the fifth end point pt5 of the adjacent shorter fanout wire 100 form the connection line. The intersection angle between first reference line B1 of the first end point pt1 of first conductive wire W1 and the third reference line B3 is defined as β. Each first conductive wire W1 is extended to form the first leading wire T1 (115) from the first end point pt1 along the direction of third reference line B3. A partial length of first leading wire 115 between first end point pt1 of the first conductive wire W1 and the intersection point 113 is defined as length "y" wherein the intersection point 113 represents an intersection position between the first leading wire T1 and the third reference line B3. The interval of fourth end points pt4 in every two second conductive wires W2 on the second reference line B2 is defined as pitch p2. A vertical connection position between the fourth end point pt4 of each fanout wire 100 and adjacent longer fanout wire 100 is defined as sixth end point pt6. The interval between the fourth end point pt4 of each fanout wire 100 and the sixth point pt6 of the adjacent longer fanout wire 100 is defined as "d". The interval between the fourth end point pt4 of the second conductive wire W2 and the sixth point pt6 is defined as distance p3 so that the length difference ΔL between two adjacent longer fanout wires 100 is represented by the following formula:

$$\Delta L = p3 - x - y = (p2 - p1)*(\cos 2\theta - \sin \theta)/\cos \theta$$

Figure 3:
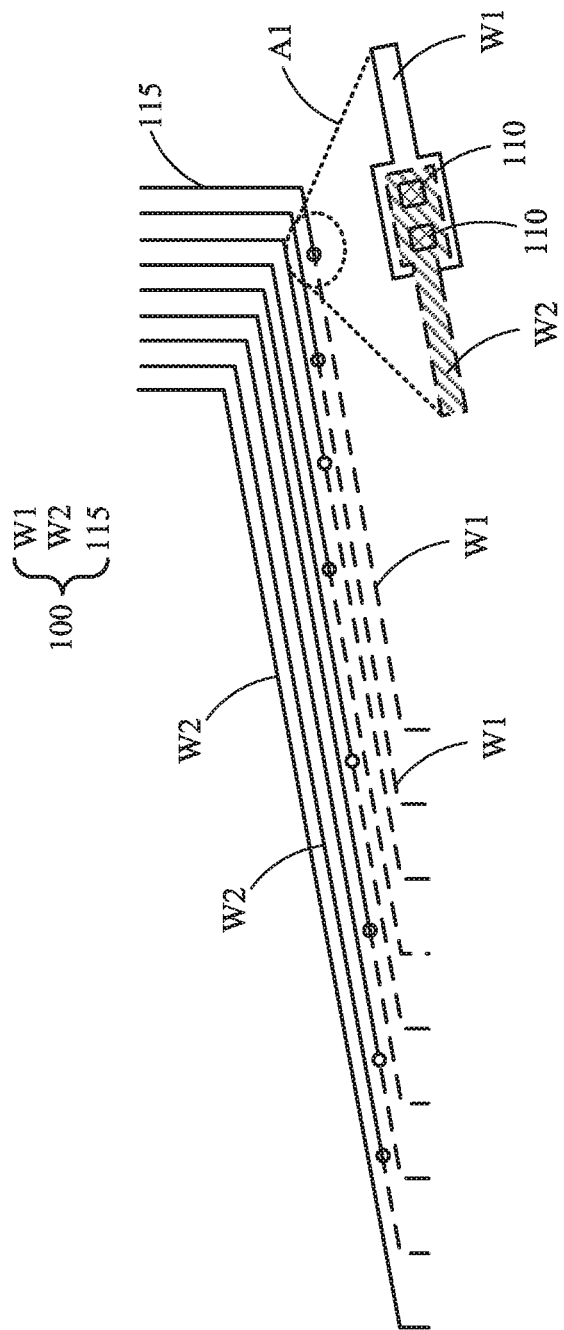
FIG. 3 is a schematic wiring arrangement view of a fanout wiring structure of a display panel according to a first embodiment of the present invention.

Please refer to FIGS. 1-3. FIG. 2 is a schematic mechanism view of a fanout wiring structure of a display panel according to one embodiment of the present invention. FIG. 3 is a schematic wiring arrangement view of a fanout wiring structure of a display panel according to a first embodiment of the present invention. The fanout wiring structure 100 of LCD panel electrically connects the signal transmission interface of the driving circuit 102 to the signal receiving interface of the LCD panel 104. The fanout wiring structure 100 includes a substrate 105 (shown in FIG. 5), a first wire region 106 and a second wire region 108. The first wire region 106 includes a plurality of first conductive wires W1 with first electric resistivity wherein each first conductive wire W1 includes a first end point pt1 and a second end point pt2 corresponding to the first end point pt1, and the first end points pt1 of the first conductive wire W1 is electrically connected to the signal transmission interface of the driving circuit 102. The first wire region 106 is defined as a region where the first conductive wires W1 are located. The second wire region 108 includes a plurality of second conductive wires W2 with second electric resistivity wherein each second conductive wire W2 includes a third end point pt3 and a fourth end point pt4 corresponding to the third end point pt3, and the fourth end points pt4 of the second conductive wire W2 is electrically connected to the signal receiving interface. The second end point pt2 of each first conductive wire W1 is electrically and correspondingly connected to the third end point pt3 of each second conductive wire W2. Each first conductive wire W1 and/or each second conductive wire W2 form a collinear structure or a parallel connection structure to construct the fanout wiring structure 100 for equalizing the resistance of each fanout wiring structure 100. The second wire region 108 is defined as a region where the second conductive wires W2 are located. When each first conductive wire W1 and/or each second conductive wires W2 form a collinear structure a parallel connection structure (locally enlarged area A1) to construct the fanout wiring structure 100, the utilization flexibility of wire-on-array (WOA) of the array substrate in the LCD panel is increased advantageously. In other words, the fanout wiring structure 100 of the present invention will not reduce the available area of the WOA.

Figure 4:
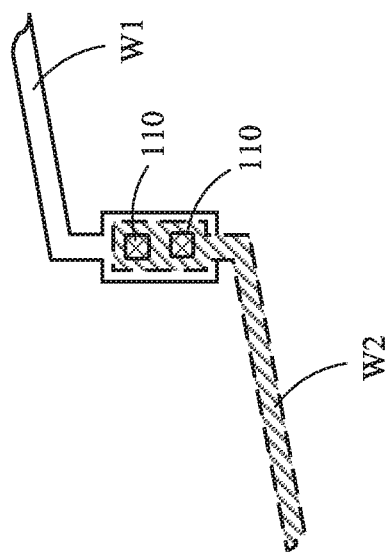
FIG. 4 is a schematic wiring arrangement view of a fanout wiring structure of a display panel according to a second embodiment of the present invention.

In one embodiment of FIG. 3, the second end point pt2 of each first conductive wire W1 is electrically connected to the third end point pt3 of each second conductive wire W2 in a collinear structure using a via hole 110, e.g. a locally enlarged area A1. In one embodiment of FIG. 4, the second end point pt2 of each first conductive wire W1 is electrically connected to the third end point pt3 of each second conductive wire W2 in a parallel connection structure using a via hole 110 so that each first conductive wire W1 is electrically connected to each second conductive wire W2 in the collinear structure except the via hole 110 in order to form the fanout wiring structure 100.

In one embodiment, the first wire region 106 and the second wire region 108 are disposed on the same material layer or different material layer such that the first conductive wires W1 is electrically connected to the second conductive wires W2 in the same material layer or different material layer. For example, the first wire region 106 and the second wire region 108 are disposed on the substrate 105 wherein the first wire region 106 and the second wire region 108 are arranged in different material layers respectively and a dielectric layer 111 (shown in FIG. 5) insulates the first wire region 106 from the second wire region 108.

Continuously referring to FIGS. 2 and 3, the connection line between the first end points pt1 of the first conductive wires W1 forms a first reference line B1. The connection line between the fourth end points pt4 of the second conductive wires W2 forms a second reference line B2. The line passing through the first end point pt1 of each first conductive wire W1 forms a plurality of third reference lines B3 and each third reference line B3 is parallel to the second reference line B2. The intersection angle between each fanout wire 100 and the second reference line B2 is defined as θ. A vertical projection distance of two first end points pt1 of every two first conductive wires W1 along the third reference line B3 is defined as a pitch p1. A vertical connection position between the first end point pt1 of each first conductive wire W1 and adjacent shorter fanout wire 100 is defined as a fifth end point pt5. The interval between the first end point pt1 of each first conductive wire W1 and the fifth end point pt5 of the adjacent shorter fanout wire 100 is defined as length "x". The intersection angle between a connection line and the first reference line B1 is defined as "α" wherein the connection between the first end point pt1 of each first conductive wire W1 and the fifth end point pt5 of the adjacent shorter fanout wire 100 form the connection line. The intersection angle between first reference line B1 of the first end point pt1 of first conductive wire W1 and the third reference line B3 is defined as "β". Each first conductive wire W1 is extended to form the first leading wire T1 (115) from the first end point pt1 along the direction of third reference line B3. A partial length of first leading wire 115 between first end point pt1 of the first conductive wire W1 and the intersection point 113 is defined as length "y" wherein the intersection point 113 represents an intersection position between the first leading wire T1 and the third reference line B3. The interval of fourth end points pt4 in every two second conductive wires W2 on the second reference line B2 is defined as pitch p2. A vertical connection position between the fourth end point pt4 of each fanout wire 100 and adjacent longer fanout wire 100 is defined as sixth end point pt6. The interval between the fourth end point pt4 of each fanout wire 100 and the sixth point pt6 of the adjacent longer fanout wire 100 is defined as "d". The interval between the fourth end point pt4 of the second conductive wire W2 and the sixth point pt6 is defined as distance p3 so that the length difference between two adjacent longer fanout wires 100 is represented by the following formula:

$$\Delta L = p3 - x - y = (p2 - p1)*(\cos 2\theta - \sin \theta)/\cos \theta$$

In one embodiment, the first electric resistivity of the first conductive wires W1 is less than the second electric resistivity of the second conductive wires W2 wherein the first fanout wire 100 in the left side includes one first conductive wire W1, and the rest of fanout wires 100, i.e. the second fanout wire to last fanout wire, respectively include one first conductive wire W1 and one second conductive wire W2.

In one embodiment, the sheet resistance of each first conductive wire W1 is defined as R1 and the sheet resistance of each second conductive wire W2 is defined as R2 so that a compensation resistance difference ΔRn between the second conductive wire W2 of "nth" fanout wire 100 and the first conductive wire W1 of the first fanout wire 100 is represented by the following formula:

$$\Delta Rn = R1*n*(p2-p1)*(\cos 2\theta - \sin \theta)/\cos \theta$$

where "n" is a positive integer which is greater than one.

In one embodiment, the compensation length "ln" of second conductive wire W2 for the n-th fanout wire 100 in comparison to the first fanout wire 100 with respect to the compensation resistance difference ΔRn is represented by the following formula:

$$ln = [R1*n*(p2-p1)*(\cos 2\theta - \sin \theta)/\cos \theta]/(R2-R1)$$

In other words, the different length "ln" is selectively added to the rest of fanout wires 100, i.e. the second fanout wire to last fanout wire.

In another embodiment, the present invention provides a LCD panel which comprises the above mentioned fanout wiring structure 100.

Figure 5:
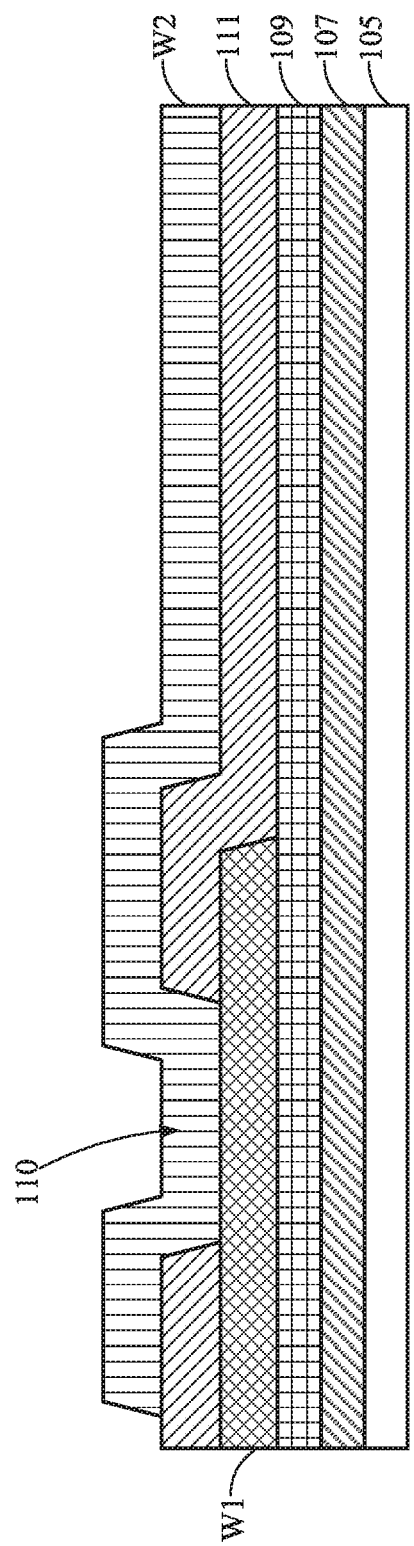
FIG. 5 is a schematic structural view of a first conductive wire and a second conductive wire of a display panel according to one embodiment of the present invention.

Furthermore, FIG. 5 is a schematic structural view of a first conductive wire W1 and a second conductive wire W2 of a display panel according to one embodiment of the present invention. A buffer layer 107 and a gate insulation layer 109 are sequentially formed on the substrate 105 and the first conductive wire W1 (or second conductive wire W2) by a process of etching a conductive layer is formed on the gate insulation layer 109. A dielectric layer 111 is then formed on the first conductive wire W1 (or second conductive wire W2). Afterwards, a via hole is formed in the end point position, e.g. second end point, of the first conductive wire W1 in the dielectric layer 111. Finally, the second conductive wire W2 (or first conductive wire W1) is formed on the dielectric layer 111 so that first conductive wire W1 and the second conductive wire W2 construct a collinear structure or a parallel connection structure.

The fanout wiring structure of the present invention equalizes the resistance of two adjacent fanout wires to reduce the difference of the maximum resistance value and the minimum resistance value so that the display status of the LCD panel is uniform to improve the color deviation and mura effect in the interests of the larger size design of the display panel.

As is understood by a person skilled in the art, the foregoing preferred embodiments of the present invention are illustrative rather than limiting of the present invention. It is intended that they cover various modifications and similar arrangements be included within the spirit and scope of the present invention, the scope of which should be accorded the broadest interpretation so as to encompass all such modifications and similar structures.

What is claimed is:

1. A fanout wiring structure in a liquid crystal display (LCD), wherein the fanout wiring structure is electrically connected to a signal transmission interface of a driving circuit and a signal receiving interface of an LCD panel, the fanout wiring structure comprising:

a substrate;

a first wire region comprising a plurality of first conductive wires with a first electric resistivity wherein each first conductive wire comprises a first end point and a second end point corresponding to the first end point, and the first end point of the first conductive wire is electrically connected to the signal transmission interface; and a second wire region comprising a plurality of second conductive wires with second electric resistivity wherein each second conductive wire comprises a third end point and a fourth end point corresponding to the third end point, and the fourth end point of the second conductive wire is electrically connected to the signal receiving interface;

wherein the second end point of each first conductive wire is electrically and correspondingly connected to the third end point of each second conductive wire, and each first conductive wire and each second conductive wire form either a collinear structure or a parallel connection structure to construct the fanout wiring structure for equalizing a resistance of each fanout wiring structure, wherein a connection line between the first end point of the first conductive wire forms a first reference line, a connection line between the fourth end point of the second conductive wire forms a second reference line, and a line passing through the first end point of each first conductive wire forms a plurality of third reference line and each third reference line is parallel to the second reference line, wherein an intersection angle between each fanout wire and the second reference line is defined as θ and the each fanout wire comprises the first conductive wire, the second conductive wire and a first leading wire, a vertical projection distance of two first end points of every two first conductive wires along the third reference line is defined as pitch p1, a vertical connection position between the first end point of each first conductive wire and adjacent shorter fanout wire is defined as a fifth end point, and an interval between the first end point of the each first conductive wire and the fifth end point of the adjacent shorter fanout wire is defined as length "x", wherein a partial length of first leading wire between the first end point of the first conductive wire and the intersection point is defined as length "y" and the intersection point represents an intersection position between the first leading wire and the third reference line, an interval of the fourth end points in every two second conductive wires on the second reference line is defined as pitch p2, a vertical connection position between the fourth end point of each fanout wire and adjacent longer fanout wire is defined as a sixth end point, an interval between the fourth end point of each fanout wire and the sixth point of the adjacent longer fanout wire is defined as "d", and an interval between the fourth end point of the second conductive wire and the sixth point is defined as distance p3 so that a length difference ΔL between two adjacent longer fanout wires is represented by the following formula:

$$\Delta L = p3 - x - y = (p2 - p1)*(\cos 2\theta - \sin \theta)/\cos \theta.$$

2. The fanout wiring structure in the LCD of claim 1, wherein the second end point of each first conductive wire is electrically connected to the third end point of each second conductive wire in a collinear structure by using a via hole.

3. The fanout wiring structure in the LCD of claim 2, wherein the first wire region and the second wire region are disposed on either a same material layer or a different material layer for electrically connecting the first conductive wires to the second conductive wire in either the same material layer or the different material layer.

4. The fanout wiring structure in the LCD of claim 1, wherein the second end point of each first conductive wire is electrically connected to the third end point of each second conductive wire in a parallel connection structure using a via hole for electrically connecting each first conductive wire to each second conductive wire in the collinear structure in order to form the fanout wiring structure.

5. The fanout wiring structure in the LCD of claim 4, wherein the first wire region and the second wire region are disposed on either a same material layer or a different material layer for electrically connecting the first conductive wires to the second conductive wire in either the same material layer or the different material layer.

6. The fanout wiring structure in the LCD of claim 1, wherein an intersection angle between a connection line and the first reference line is defined as α and the connection line between the first end point of each first conductive wire and the fifth end point of the adjacent shorter fanout wire form the connection line, an intersection angle between the first reference line of the first end point of first conductive wire and the third reference line is defined as β, and each first conductive wire is extended to form the first leading wire from the first end point along a direction of the third reference line.

7. The fanout wiring structure in the LCD of claim 6, wherein the first electric resistivity of the first conductive wire is less than the second electric resistivity of the second conductive wire, the first fanout wire comprises one first conductive wire, and the rest of fanout wires respectively comprise one first conductive wire and one second conductive wire.

8. The fanout wiring structure in the LCD of claim 7, wherein a sheet resistance of each first conductive wire is defined as R1 and a sheet resistance of each second conductive wire is defined as R2 so that a compensation resistance difference ΔRn between the second conductive wire of "nth" fanout wire and the first conductive wire of the first fanout wire is represented by the following formula:

$$\Delta Rn = R1*n*(p2-p1)*(\cos 2\theta - \sin \theta)/\cos \theta;$$

where "n" is a positive integer which is greater than one.

9. The fanout wiring structure in the LCD of claim 8, wherein a compensation length "ln" of the second conductive wire for the n-th fanout wire in comparison to the first fanout wire based on the compensation resistance difference ΔRn is represented by the following formula:

$$ln = [R1*n*(p2-p1)*(\cos 2\theta - \sin \theta)/\cos \theta]/(R2-R1).$$

10. An LCD panel, comprising:
a driving circuit; and
a fanout wiring structure for electrically connecting a signal transmission interface of the driving circuit to a signal receiving interface of the LCD panel, the fanout wiring structure comprising:
 a substrate;
 a first wire region comprising a plurality of first conductive wires with a first electric resistivity wherein each first conductive wire comprises a first end point and a second end point corresponding to the first end point, and the first end point of the first conductive wire is electrically connected to the signal transmission interface; and
 a second wire region comprising a plurality of second conductive wires with second electric resistivity wherein each second conductive wire comprises a third end point and a fourth end point corresponding to the third end point, and the fourth end point of the second conductive wire is electrically connected to the signal receiving interface;
 wherein the second end point of each first conductive wire is electrically and correspondingly connected to the third end point of each second conductive wire, and each first conductive wire and each second conductive wire form either a collinear structure or a parallel connection structure to construct the fanout wiring structure for equalizing a resistance of each fanout wiring structure,
 wherein a connection line between the first end point of the first conductive wire forms a first reference line, a connection line between the fourth end point of the second conductive wire forms a second reference line, and a line passing through the first end point of each first conductive wire forms a plurality of third reference line and each third reference line is parallel to the second reference line,
 wherein an intersection angle between each fanout wire and the second reference line is defined as θ and the each fanout wire comprises the first conductive wire, the second conductive wire and a first leading wire, a vertical projection distance of two first end points of every two first conductive wires along the third reference line is defined as pitch p1 , a vertical connection position between the first end point of each first conductive wire and adjacent shorter fanout wire is defined as a fifth end point, and an interval between the first end point of the each first conductive wire and the fifth end point of the adjacent shorter fanout wire is defined as length "x", and
 wherein a partial length of first leading wire between the first end point of the first conductive wire and the intersection point is defined as length "y" and the intersection point represents an intersection position between the first leading wire and the third reference line, an interval of the fourth end points in every two second conductive wires on the second reference line is defined as pitch p2, a vertical connection position between the fourth end point of each fanout wire and adjacent longer fanout wire is defined as a sixth end point, an interval between the fourth end point of each fanout wire and the sixth point of the adjacent longer fanout wire is defined as "d", and an interval between the fourth end point of the second conductive wire and the sixth point is defined as distance p3 so that a length difference ΔL between two adjacent longer fanout wires is represented by the following formula:

$$\Delta L = p3 - x - y = (p2-p1)*(\cos 2\theta - \sin \theta)/\cos \theta.$$

11. The LCD panel of claim 10, wherein the second end point of each first conductive wire is electrically connected to the third end point of each second conductive wire in a collinear structure by using a via hole.

12. The LCD panel of claim 11, wherein the first wire region and the second wire region are disposed on either a same material layer or a different material layer for electrically connecting the first conductive wires to the second conductive wire in either the same material layer or the different material layer.

13. The LCD panel of claim 10, wherein the second end point of each first conductive wire is electrically connected to the third end point of each second conductive wire in a parallel connection structure using a via hole for electrically connecting each first conductive wire to each second conductive wire in the collinear structure in order to form the fanout wiring structure.

14. The LCD panel of claim 13, wherein the first wire region and the second wire region are disposed on either a same material layer or a different material layer for electrically connecting the first conductive wires to the second conductive wire in either the same material layer or the different material layer.

15. The LCD panel of claim 10,
wherein an intersection angle between a connection line and the first reference line is defined as $\alpha$ and the connection line between the first end point of each first conductive wire and the fifth end point of the adjacent shorter fanout wire form the connection line, an intersection angle between the first reference line of the first end point of first conductive wire and the third reference line is defined as $\beta$, and each first conductive wire is extended to form the first leading wire from the first end point along a direction of the third reference line.

16. The LCD panel of claim 15, wherein the first electric resistivity of the first conductive wire is less than the second electric resistivity of the second conductive wire, the first fanout wire comprises one first conductive wire, and the rest of fanout wires respectively comprise one first conductive wire and one second conductive wire.

17. The LCD panel of claim 16, wherein a sheet resistance of each first conductive wire is defined as R1 and a sheet resistance of each second conductive wire is defined as R2 so that a compensation resistance difference $\Delta Rn$ between the second conductive wire of "nth" fanout wire and the first conductive wire of the first fanout wire is represented by the following formula:

$$\Delta Rn = R1 * n * (p2-p1) * (\cos 2\theta - \sin \theta)/\cos \theta;$$

where "n" is a positive integer which is greater than one.

18. The LCD panel of claim 17, wherein a compensation length "ln" of the second conductive wire for the n-th fanout wire in comparison to the first fanout wire based on the compensation resistance difference $\Delta Rn$ is represented by the following formula:

$$ln = [R1 * n * (p2-p1) * (\cos 2\theta - \sin \theta)/\cos \theta]/(R2-R1).$$

* * * * *